United States Patent [19]
Choi et al.

[11] Patent Number: 5,833,783
[45] Date of Patent: Nov. 10, 1998

[54] LEAD FRAME TAPING APPARATUS AND TAPING METHOD

[75] Inventors: O-dong Choi; Jong-uk Kim, both of Kyongsangnam-do, Rep. of Korea

[73] Assignee: Samsung Aerospace Industries, Ltd., Kyongsangnam-do, Rep. of Korea

[21] Appl. No.: 736,749

[22] Filed: Oct. 25, 1996

[30] Foreign Application Priority Data

| Oct. 25, 1995 | [KR] | Rep. of Korea | 1995-30274 |
| Oct. 25, 1995 | [KR] | Rep. of Korea | 1995-37158 |
| Oct. 25, 1995 | [KR] | Rep. of Korea | 1995-37159 |
| Oct. 16, 1996 | [KR] | Rep. of Korea | 1996-46319 |

[51] Int. Cl.$^6$ .................................................. B32B 31/00
[52] U.S. Cl. ........................ 156/64; 156/251; 156/352; 156/362; 156/363; 156/511; 156/515; 156/557
[58] Field of Search ..................... 156/64, 251, 352, 156/362, 363, 364, 366, 511, 515, 516, 557; 250/223 R, 227.11, 559.28

[56] References Cited

U.S. PATENT DOCUMENTS

| 4,046,613 | 9/1977 | Kucheck et al. | 156/366 X |
| 4,089,728 | 5/1978 | Teed | 156/352 |
| 4,680,080 | 7/1987 | Instance | 156/363 X |
| 4,685,982 | 8/1987 | Kucheck | 156/64 |
| 4,931,127 | 6/1990 | Matsumoto | 156/363 X |
| 5,055,155 | 10/1991 | Crotty et al. | 156/511 X |

FOREIGN PATENT DOCUMENTS

| 4-243757 A | 8/1992 | Japan | 156/511 |
| 5-228998 A | 9/1993 | Japan | 156/352 |
| 2043024 | 10/1980 | United Kingdom | 156/366 |
| 2150098 | 6/1985 | United Kingdom | 156/557 |

*Primary Examiner*—David A. Simmons
*Assistant Examiner*—Paul M. Rivard
*Attorney, Agent, or Firm*—Finnegan, Henderson, Farabow, Garrett & Dunner, L.L.P.

[57] ABSTRACT

In a lead frame taping apparatus and a method thereof, a plurality of punching portions are provided and each punching portion concurrently attaches a tape to at least two lead frames. Also, the tape can be continuously attached to the different kinds of a lead frame without the exchange of molds by differing the operation time of each punching portion. Further, a taping detecting sensor is provided to detect the attachment of the tape at the lead frame. Therefore, productivity is increased while saving labor and inferior products can be accurately detected.

17 Claims, 10 Drawing Sheets

LEAD FRAME TAPING APPARATUS AND TAPING METHOD

SUMMARY OF THE INVENTION

The present invention relates to a lead frame taping apparatus, and more particularly, to a lead frame taping apparatus which provides the ability to concurrently attach tapes on a plurality of lead frames using a plurality of punches.

Also, the present invention relates to a lead frame taping apparatus having a taping detecting sensor for detecting whether the tape is attached to the lead frame, and to a taping method thereof.

A lead frame, which is a component of a semiconductor package, is for electrically connecting a semiconductor chip mounted thereon to an external circuit while supporting the chip. Careful manufacturing and handling of the lead frame is required since the lead frame is very small and fragile. Lead frames of various shapes and sizes are required as the semiconductor industry grows and the need for various semiconductor packages increases. Accordingly, an apparatus for manufacturing various kinds of lead frames efficiently and rapidly has been introduced.

A lead frame is made of a thin metal plate and, as shown in FIG. 1, comprises a pad 11 for supporting a semiconductor chip 10, inner leads 12 connected to a circuit of the chip 10 by means of wires 13, and outer leads 14 connected to the inner leads 12 and an external circuit.

Manufacturing of the lead frame comprises a process of plating the end portion of the inner leads 12 and the pad 11, and a bonding process of connecting the inner leads 12 and the pad 11. A taping process for attaching tapes 15a and 15b at predetermined positions on the inner leads 12 is performed prior to the bonding process. The taping process is performed through a lead frame taping apparatus. A conventional lead frame taping apparatus is shown in FIG. 2.

Referring to FIG. 2, the conventional lead frame taping apparatus comprises a roll supporter 21 for rotatably supporting a roll of lead frames 20 and for unwinding the lead frames 20, a lead frame supplying portion 30 for providing the lead frame 20 released from the roll supporter 21 intermittently by predetermined lengths, a supplying detector 23 for detecting the provided lead frame 20, a punching portion 40 for attaching tapes 15a and 15b to the provided lead frame 20, a leveler 24 for leveling the lead frame 20 attached with the tapes 15a and 15b, and a cutting and stacking apparatus 50 for cutting and stacking the tape-attached lead frame 20 passing through the leveler 24 in predetermined lengths.

Also, the lead frame taping apparatus is provided with a tape supplying portion (not shown) for providing the tapes 15a and 15b and a heater block 44 is provided under the lead frame 20.

In the operation of the conventional lead frame taping apparatus, a punch 41 driven by an actuator 42 punches the tapes 15a and 15b according to the shape of a punching mold 43, and attaches the punched tapes on the lead frame 20.

FIG. 3 is a plan view showing a part of the conventional lead frame taping apparatus. Referring to the drawing, the lead frame taping apparatus comprises a tape supplying portion 60 for providing the tapes 15a and 15b to the lead frame 20 being supplied and a punching portion 40 for punching and severing the provided tapes 15a and 15b to attach the same to the lead frame 20.

The tape supplying portion 60 comprises a supply roller 61 for supplying the tapes 15a and 15b and a collecting roller 62 for collecting a vinyl cover 15' from the tape. The tapes 15a and 15b are unwound from the supply roller 61, according to the intermittent rotation of a rotation roller 63, and transferred toward the punching mold 43 (FIG. 2) of the punching portion 40 by a pitch. As used in the present specification and claims, "pitch" denotes a distance corresponding to the interval between the lead frames. At the outer circumferential surface of the rotation roller 63, a rubber member (not shown) having a relatively large friction coefficient is attached and the tapes 15a and 15b are transferred due to the frictional force between the rubber member and the tapes 15a and 15b during the rotation of the rotation roller 63.

The punching portion 40 comprises a punch 41 driven by an actuator 42 to attach the tapes 15a and 15b to the lead frame 20. The tapes 15a and 15b are concurrently attached by the punch 41 to the inner leads 12 (see FIG. 1) of the lead frame 20 supplied to the punching portion 40.

However, in such a lead frame taping apparatus, since each line of the tapes 15a and 15b is provided to both edges of the lead frame 20 being supplied and thus the taping process is performed with respect to one lead frame 20a (separated by a dotted line in FIG. 2), it is low in productivity and disadvantageous for mass production.

Further, since only one punching portion 40 having a single punching mold 43 is provided to the lead frame taping apparatus, it is a problem that the taping process is performed for only one lead frame 20a and an inordinate amount of production time is lost when the punching mold 43 must be changed due to a change in the type of a lead frame being produced. That is, when the size and type of the punching mold 43 is changed, the producing process must be halted and then restarted after the punching mold 43 is changed.

Meanwhile, in the conventional lead frame taping apparatus, the process of attaching the tapes 15a and 15b to the lead frame 20 by means of the punching portion 40 is affected by attachment conditions, which results in a high reject ratio. That is, when the tapes 15a and 15b are attached to the lead frame 20, the temperature of the heater block 44 is usually maintained over 170° C. Due to the high temperature, or low air pressure (less than a regulated value) provided to the actuator 42, the tapes 15a and 15b sometimes do not attach. Since a worker is require to examine the products for such problems during the taping process, hard work is required and reliability in detecting defective products varies according to the attention and skill of the worker.

SUMMARY OF THE INVENTION

To solve the above problems, it is an object of the present invention to provide a lead frame taping apparatus for concurrently attaching tapes to at least two lead frames.

Accordingly, to achieve the object, there is provided a lead frame taping apparatus comprising: a lead frame supplying portion for intermittently supplying a lead frame by at least two pitches to concurrently supply two lead frames at one time; a tape supplying portion for concurrently supplying a tape to each of said lead frames being supplied; a punch and a punching portion for concurrently cutting the supplied tapes and attaching the cut tape to each of said lead frames, wherein the tapes are supplied between said punch and said punching mold; and an actuator for moving the punch up and down.

It is another object of the present invention to provide a lead frame taping apparatus having a plurality of punching portions to attach a tape to a lead frame of a different kind without exchanging a punching mold.

To achieve the above object, there is provided a lead frame taping apparatus comprising: a plurality of punching portions, each having a punch and a punching mold for cutting a tape supplied therebetween and attaching the cut tape to a lead frame, and an actuator for moving the punch up and down; a lead frame supplying portion for intermittently supplying the lead frame by a plurality of pitches toward the plurality of punching portions; and a tape supplying portion for supplying the tape to the lead frame supplied to the respective punching portion.

According to another aspect of the present invention, there is provided a lead frame taping apparatus comprising: a plurality of punching portions, each having a punch and a punching mold for cutting a tape supplied therebetween and attaching the cut tape to at least two lead frames, and an actuator for moving the punch up and down; a lead frame supplying portion for intermittently supplying the frame by the pitch of a multiple of the number of the punching portions; and a tape supplying portion for supplying the tape to the lead frame supplied toward the plurality of punching portions.

It is preferable that the punch and the punching mold of each punching portion concurrently attach the tape to two lead frames and the lead frame supplying portion supply the lead frame by a pitch equal to twice the number of the punching portions.

Preferably, the present invention includes a taping detecting sensor for radiating light to the taped lead frame and for detecting whether the tape is attached to the lead frame according to the transmitted light amount. The taping detecting sensor comprises: an optical transmitter for emitting light around a portion of the lead frame where the tape is attached, an optical receiver for receiving the light passed through the lead frame, a signal converter for converting the received light to electrical signals, a controller for receiving the electrical signals from the signal converter and determining whether the tape is attached, and a driver for receiving an operation stop signal from the controller and halting the operation of the punching portion.

It is yet another object of the present invention to provide a method of taping a lead frame comprising a step of automatically detecting the attachment of a tape to the lead frame taped by a taping apparatus.

To achieve the above object, there is provided a method of taping a lead frame comprising the steps of: providing a lead frame; attaching a tape to the provided lead frame; emitting light to the edge of the taped lead frame; measuring the amount of light penetrating the lead of lead frame and comparing the measured amount with a reference value; if the measured light amount is over the reference value, stopping the taping process; and if the measured light amount is not over the reference value, continuing the taping process.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 4:
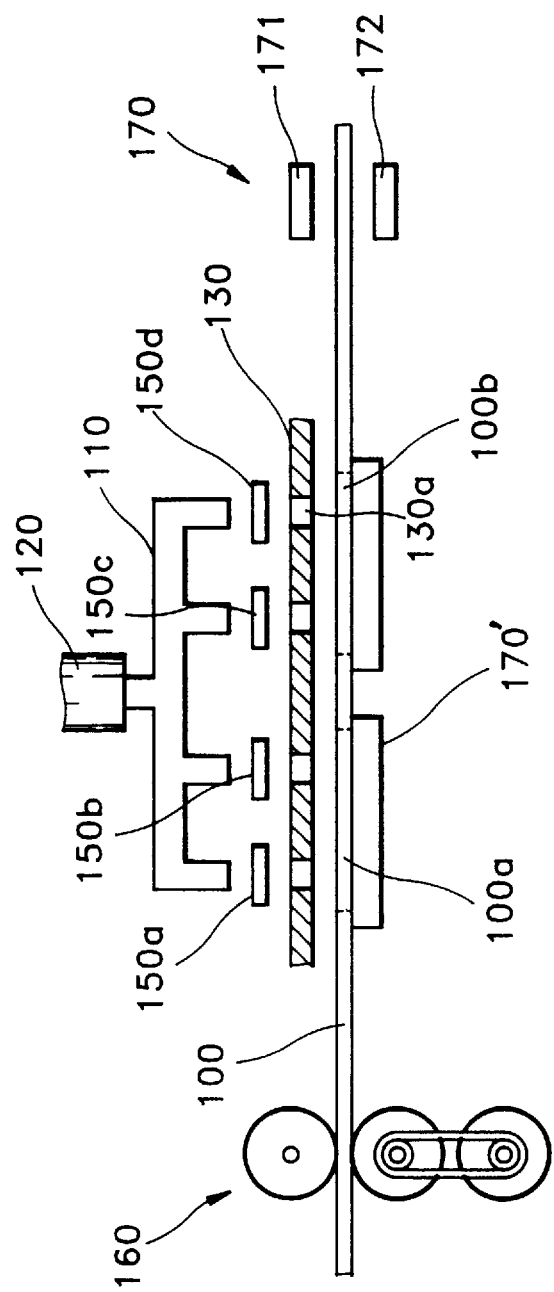
FIG. 4 is a side view showing a lead frame taping apparatus according to a first embodiment of the present invention.
Figure 5:
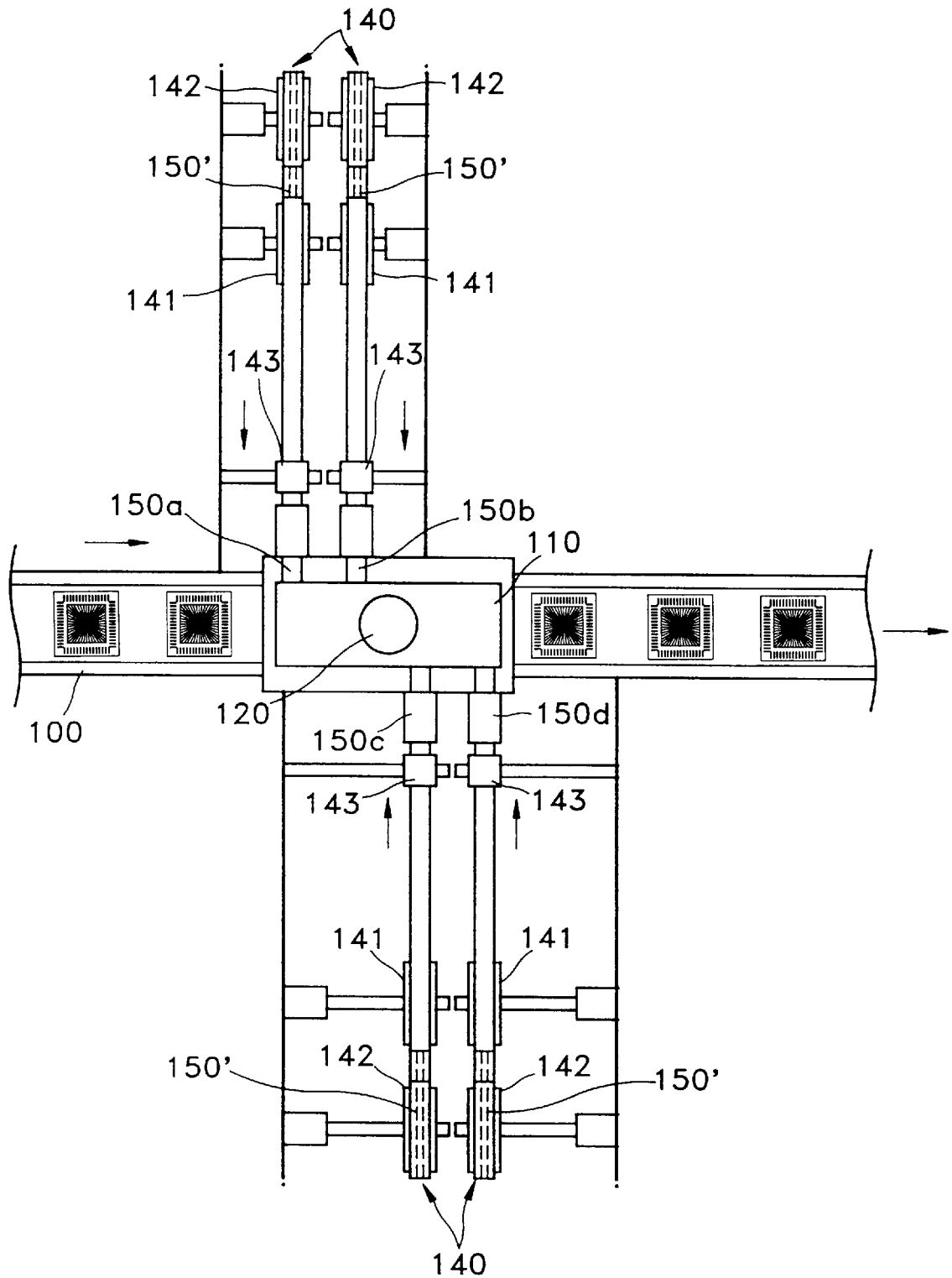
FIG. 5 is a plan view of the lead frame taping apparatus shown in FIG. 4.

A lead frame taping apparatus according to a first embodiment of the present invention is illustrated in FIGS. 4 and 5. Referring to the drawings, the present lead frame taping apparatus concurrently attaches tapes 150a, 150b, 150c, and 150d to at least two lead frames 100a and 100b (indicated by dotted lines) by a single punching operation.

The lead frame taping apparatus includes a punch 110 lifted up and down by an actuator 120 and a punching mold 130 having an insertion hole 130a through which the punch 110 passes. The tapes 150a, 150b, 150c, and 150d are supplied by a tape supplying portion 140 (FIG. 5) to a region between the punch 110 and the punching mold 130. The tape supplying portion 140 includes a supplying roller 141 for supplying the tape 150a and a collecting roller 142 for collecting a vinyl cover 150' from the tape 150a.

Under the punching mold 130, a lead frame 100 is provided by a lead frame supplying portion 160 (FIG. 4) and a heater block 170' is provided under the lead frame 100 being provided under the punching mold 130.

In an operation of the lead frame taping apparatus according to the present embodiment, the lead frame 100 is intermittently supplied by at least two pitches by the lead frame supplying portion 160. Thus, two lead frames 100a and 100b are concurrently supplied under the punching mold 130.

The tapes 150a, 150b, 150c, and 150d are supplied between the punch 110 and the punching mold 130 as being unwound from the supplying roller 141 by the intermittent rotation of the rotation roller 143. Then, the punch 110 being lowered by the driving of the actuator 120 cuts the tapes 150a, 150b, 150c, and 150d and attaches the cut tapes at both sides of each of the two lead frames 100a and 100b. That is, the tapes 150a and 150b are attached at opposite sides of the lead frame 100a, and the tapes 150c, and 150d at opposite sides of the lead frame 100b. After the attachment of the tapes, the punch 110 ascends by the driving of the actuator 120, and the lead frame supplying portion 160 supplies the lead frame 100 by two pitches. Then, the above-mentioned action is repeated. As a result, the lead frame taping apparatus of the present embodiment concurrently attaches the tapes at two lead frames by a single punching operation.

Figure 6:
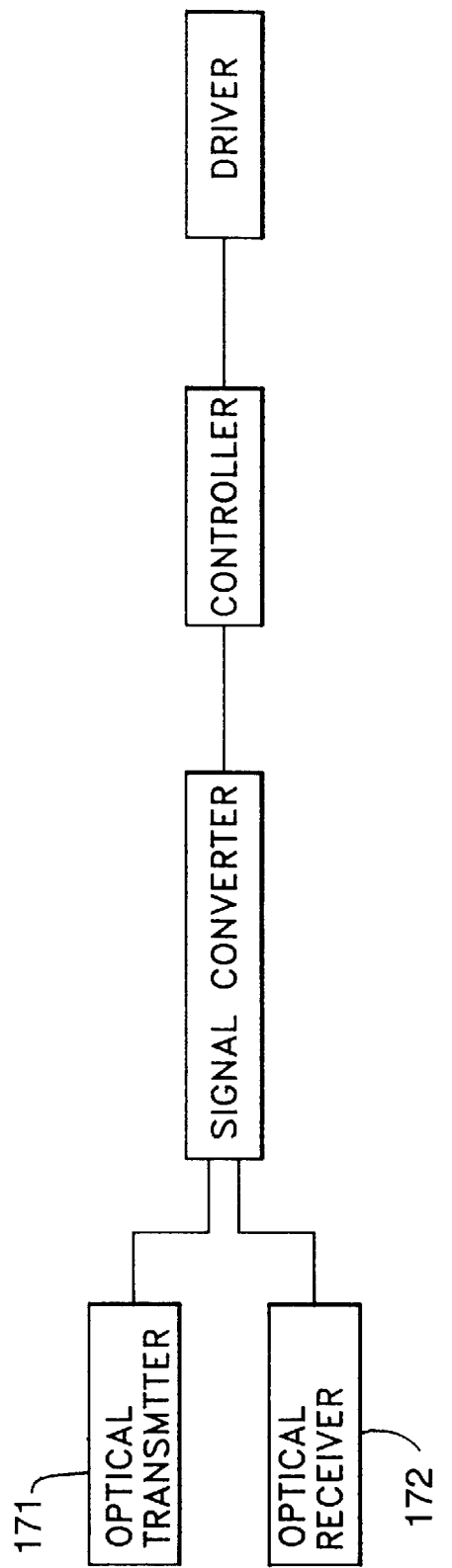
FIG. 6 is a block diagram showing the structure of a taping detecting sensor adopted in the lead frame taping apparatus of the present invention.

Also, the present lead frame apparatus further includes a taping detecting sensor 170 (FIG. 4) for detecting whether the tapes 150a, 150b, 150c, and 150d are attached at the lead frame 100. Referring to FIGS. 4 and 6, the taping detecting sensor 170 comprises an optical transmitter 171 for emitting light, an optical receiver 172 for receiving the radiated light, a signal converter for converting the light into an electric signal, a controller for determining the attachment of the tape by receiving the electric signal from the signal converter and for generating an operation stop signal when a tape is not attached, and a driver for halting the operation of the lead frame taping apparatus by receiving the operation stop signal from the controller.

Here, the optical transmitter 171 and the optical receiver 172 are positioned over and under the transfer route of the lead frames 100, respectively. The optical transmitter 171 can be structured by a plurality of optical fibers. Other equivalent configurations are, of course, possible.

Figure 7:
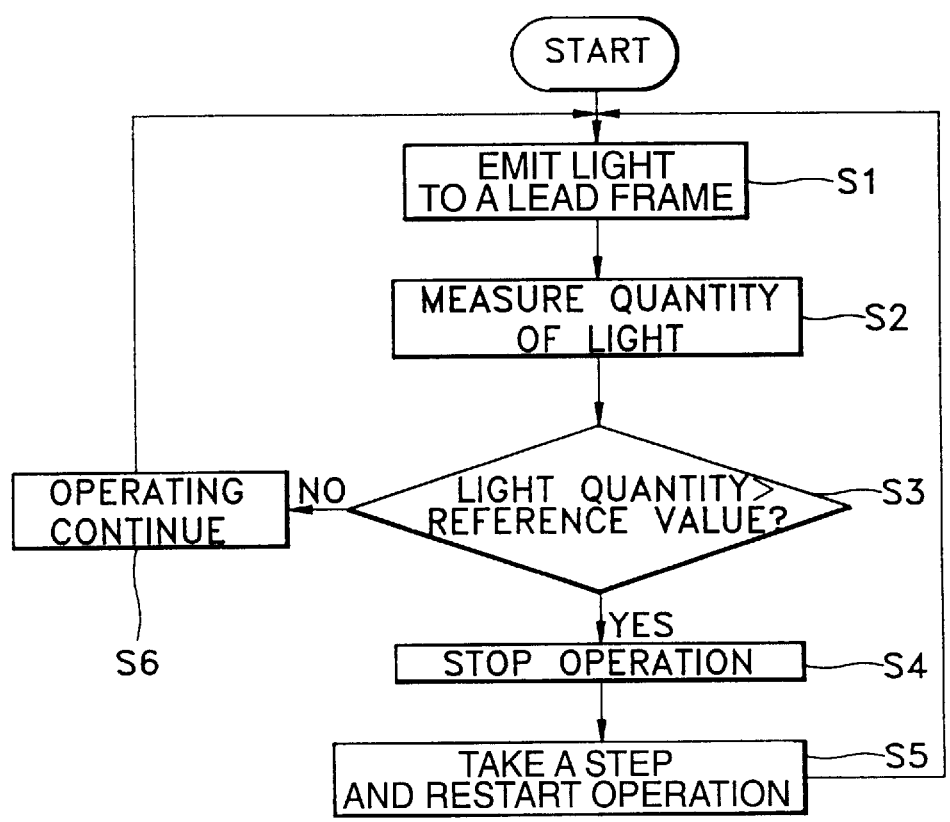
FIG. 7 is a flowchart for explaining a method of taping the lead frame according to the present invention.

A lead frame taping method using the present lead frame taping apparatus having the taping detecting sensor 170 will now be described referring to FIGS. 4, 6, and 7.

Figure 1:
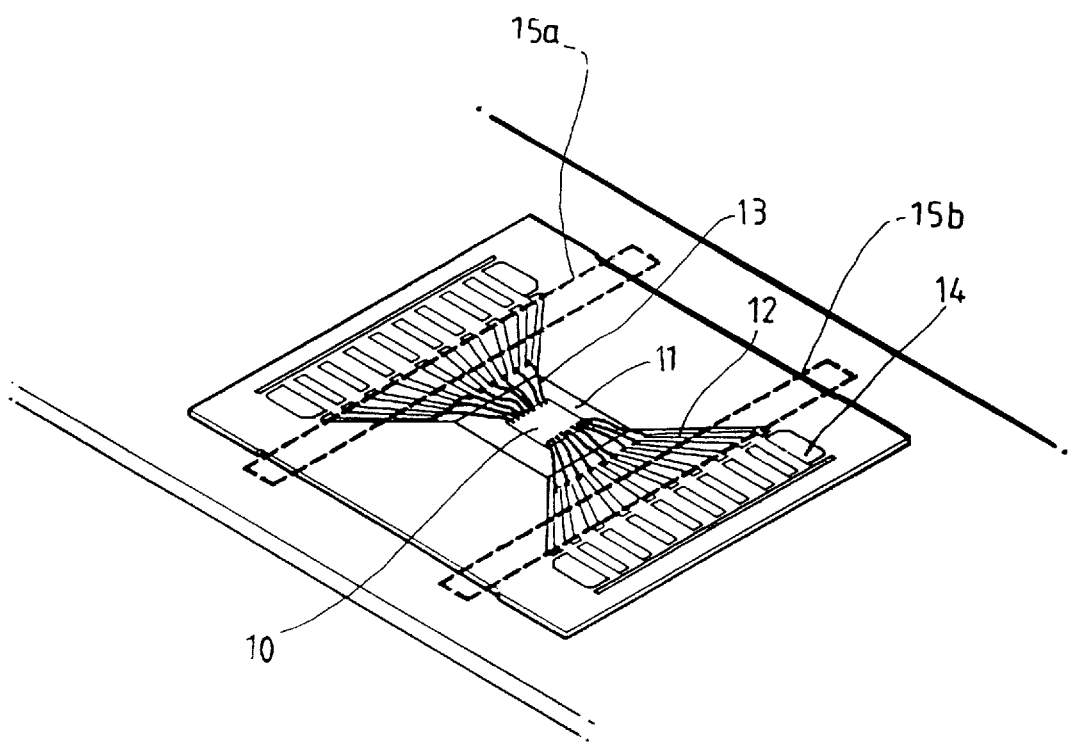
FIG. 1 is a perspective view illustrating a typical tape-attached lead frame.
Figure 2:
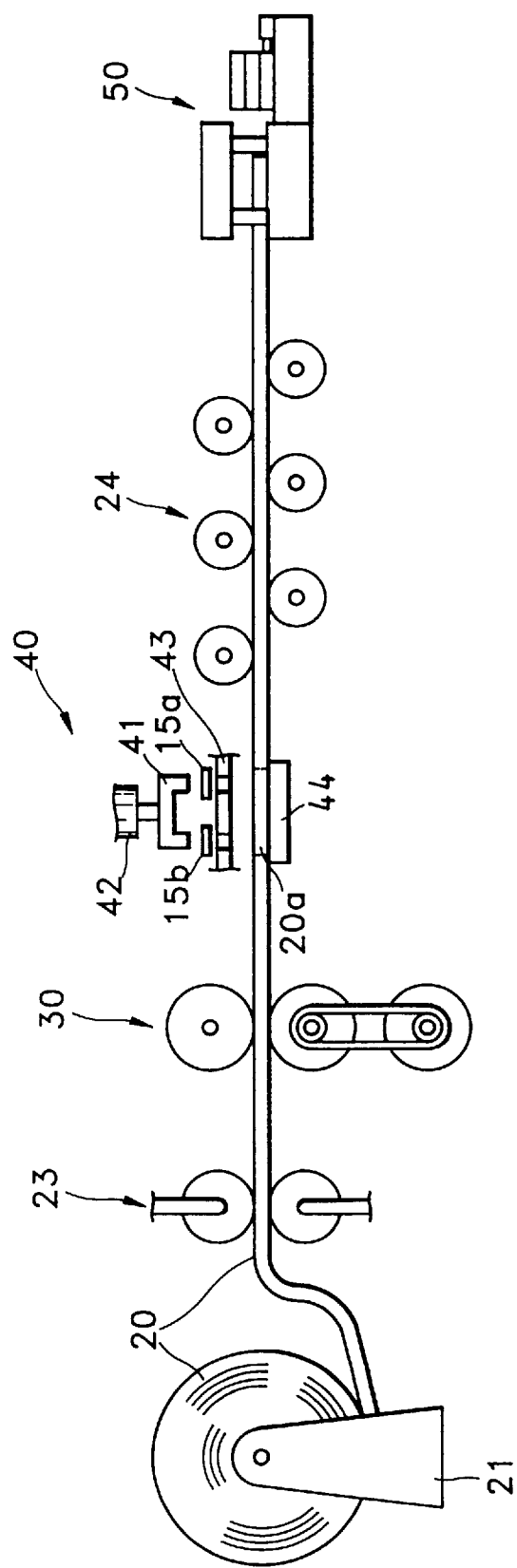
FIG. 2 is a side view schematically illustrating a conventional lead frame taping apparatus.
Figure 3:
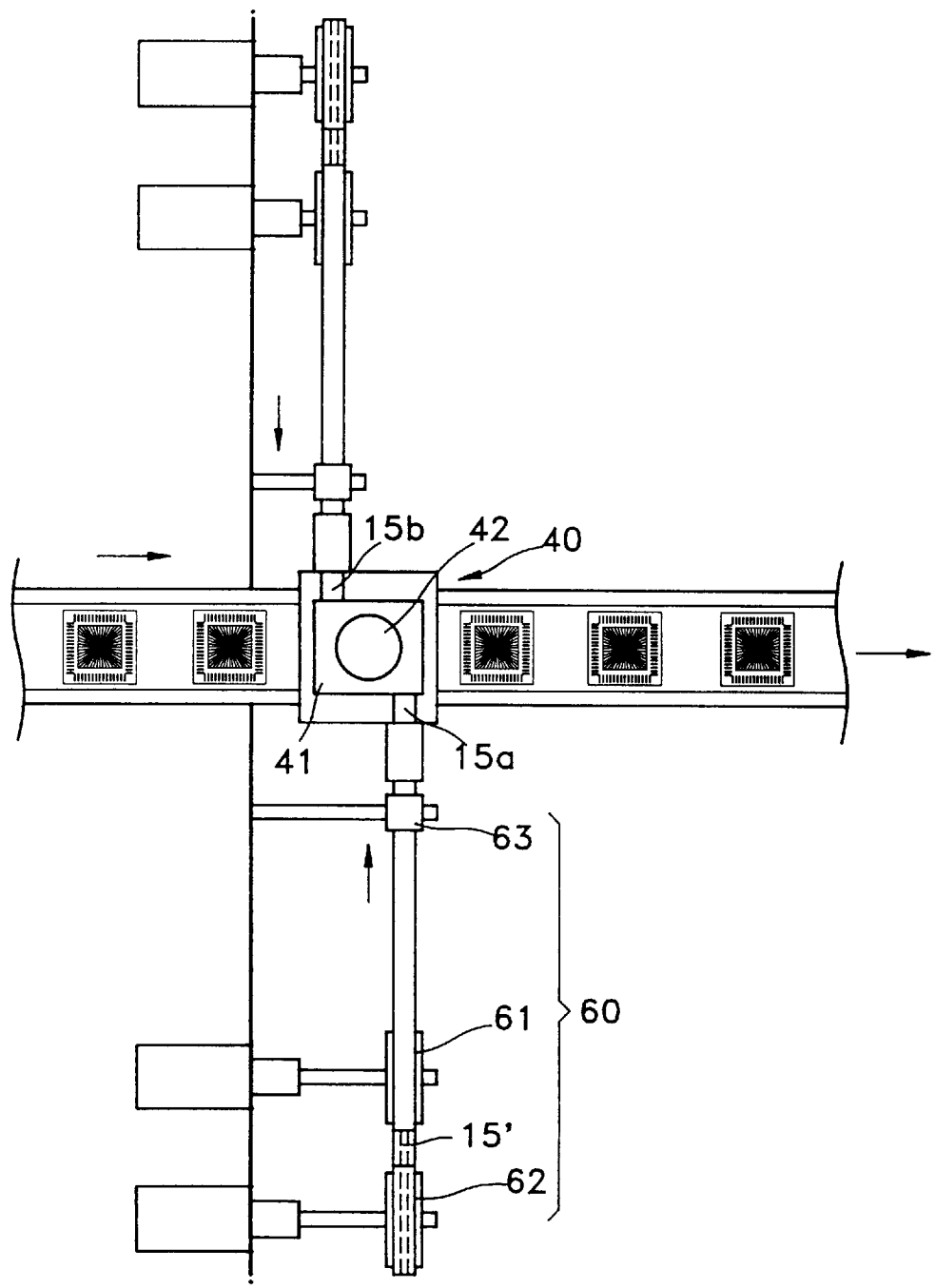
FIG. 3 is a plan view schematically illustrating a part of the lead frame taping apparatus shown in FIG. 2.

The lead frames 100 where the tapes 150a, 150b, 150c, and 150d are attached passes the taping detecting sensor 170. When the lead frames 100a and 100b (collectively referred to as "lead frames 100") are disposed under the taping detecting sensor 170, light of a particular amount is transmitted from the optical transmitter 171 to the lead frames 100, in step S1. Preferably, a point to which the light is transmitted from the optical transmitter 171 will be the edge of the lead frames 100 where the tapes 150a, 150b, 150c, and 150d are attached. At this time, if the tapes 150a, 150b, 150c, and 150d are attached to the lead frame 100, the light transmitted will be reflected therefrom and only a small amount of light will be passed through the inner and outer leads 12 and 14 (see FIG. 1). On the contrary, when the tapes 150a, 150b, 150c, and 150d are not attached to the lead frame 100, a relatively large amount of light will pass through the leads 12 and 14. Then, the optical receiver 172 opposing the optical transmitter 171 receives the light passed therethrough, in step S2, and then converts the received light into an electric signal to send the converted signal to the controller. The controller determines whether the light amount is greater than a predetermined reference value, in step S3.

When the transmitted light amount is greater than the predetermined reference value, which means the tapes 150a, 150b, 150c, and 150d are not attached, a signal for halting the operation of the lead frame taping apparatus is sent to the driver and then the driver stops the operation of the lead frame taping apparatus according to the signal, in step S4. Then, the worker can respond to matter and restart the operation of the lead frame taping apparatus, in step S5. When the transmitted light amount is less than the predetermined reference value, the controller determines that the tapes 150a, 150b, 150c, and 150d properly attached and the taping process continues, in step S6.

Figure 8:
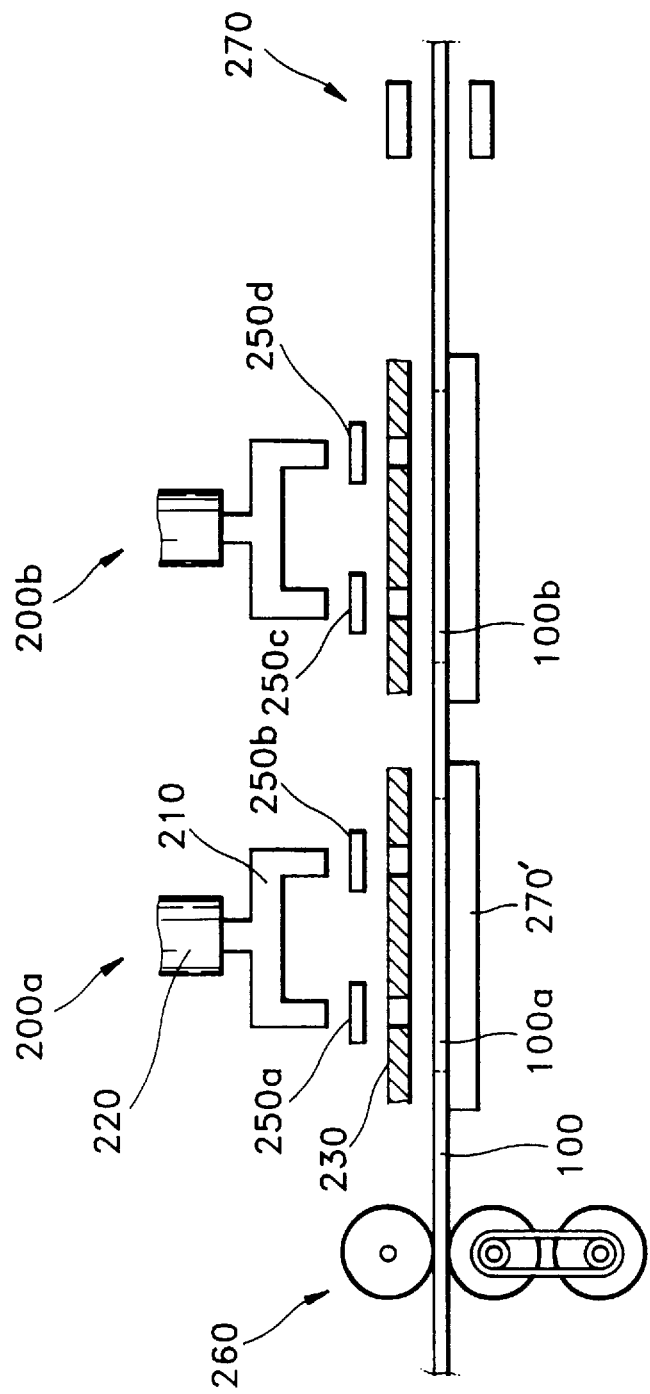
FIG. 8 is a side view illustrating a lead frame taping apparatus according to a second embodiment of the present invention.

The lead frame taping apparatus according to the second embodiment of the present invention includes a plurality of punching portions. Referring to FIG. 8, the present lead frame taping apparatus includes two punching portions 200a and 200b, a lead frame supplying portion 260 for supplying the lead frames 100 to the punching portions 200a and 200b, and a tape supplying portion 140 (see FIG. 5) for supplying tapes 250a, 250b, 250c, and 250d to the lead frames 100 supplied to each of the punching portions 200a and 200b. In the present embodiment, two punching portions 200a and 200b are provided and the lead frame supplying portion 260 supplies the lead frames 100 by two pitches so that the taping process is made with respect to the two lead frames 100a and 100b (indicated by dotted lines in FIG. 8). Further, a plurality of punching portions can be provided, and at this time, the taping process to a plurality of the lead frames can be made by supplying the lead frames 100 by a number of pitches corresponding to the number of the plural punching portions.

Each of the punching portions 200a and 200b includes a punch 210 and a punching mold 230 for cutting the tapes 250a, 250b, 250c, and 250d and attaching the cut tapes to the lead frame 100, and an actuator 220 for moving the punch 210 up and down. A heater block 270 is provided under the lead frame 100 where the tapes 250a, 250b, 250c, and 250d are attached.

According to the present embodiment, the plurality of punching portions 200a and 200b can be operated either concurrently or at a different time. When the punching portions 200a and 200b are operated at a different time, the operation time of the actuator 220 located at the N-th and the (N+1)th positions can be different from each other. Here, the lead frame 100 of a different type can be selectively taped by differing the punch 210 and the punching mold 230 of each of the punching portions 200a and 200b. That is, when a taping process is performed to the lead frame 100a of an A type, the punching portion 200a is operated and another punching portion 200b is halted. Then, when the lead frame 100b of a B type is supplied, the punching portion 200a halts and another punching portion 200b operates. Thus, the tapes can be continuously attached at the lead frame 100 of a different type by selectively operating the punching portions 200a and 200b. Namely, though the types of the lead frames 100a and 100b are different, there is no need to accordingly exchange the punch 210 and the punching mold 230.

A taping detecting sensor 270 for detecting the attachment of the tape can be further provided to the lead frame taping apparatus of the present embodiment, and the structure and action of the taping detecting sensor 270 are the same as in the above-mentioned embodiment.

Figure 9:
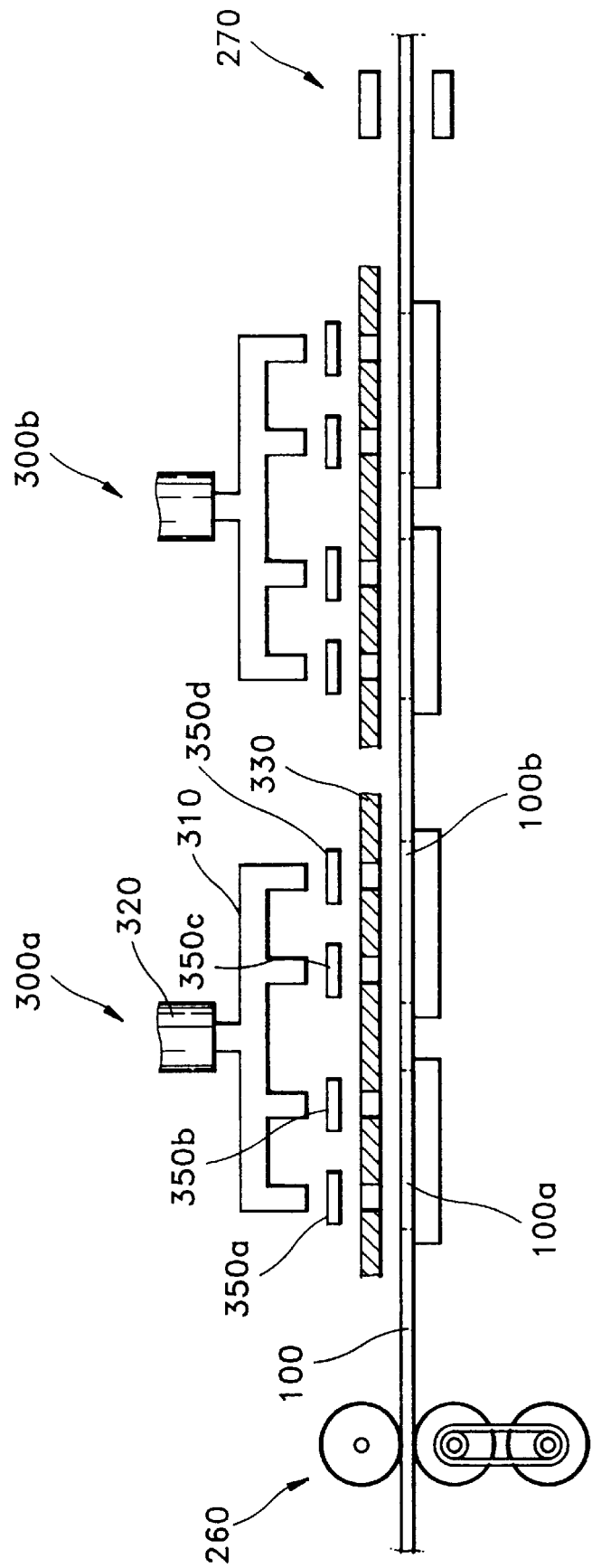
FIG. 9 is a side view illustrating a lead frame taping apparatus according to a third embodiment of the present invention.
Figure 10:
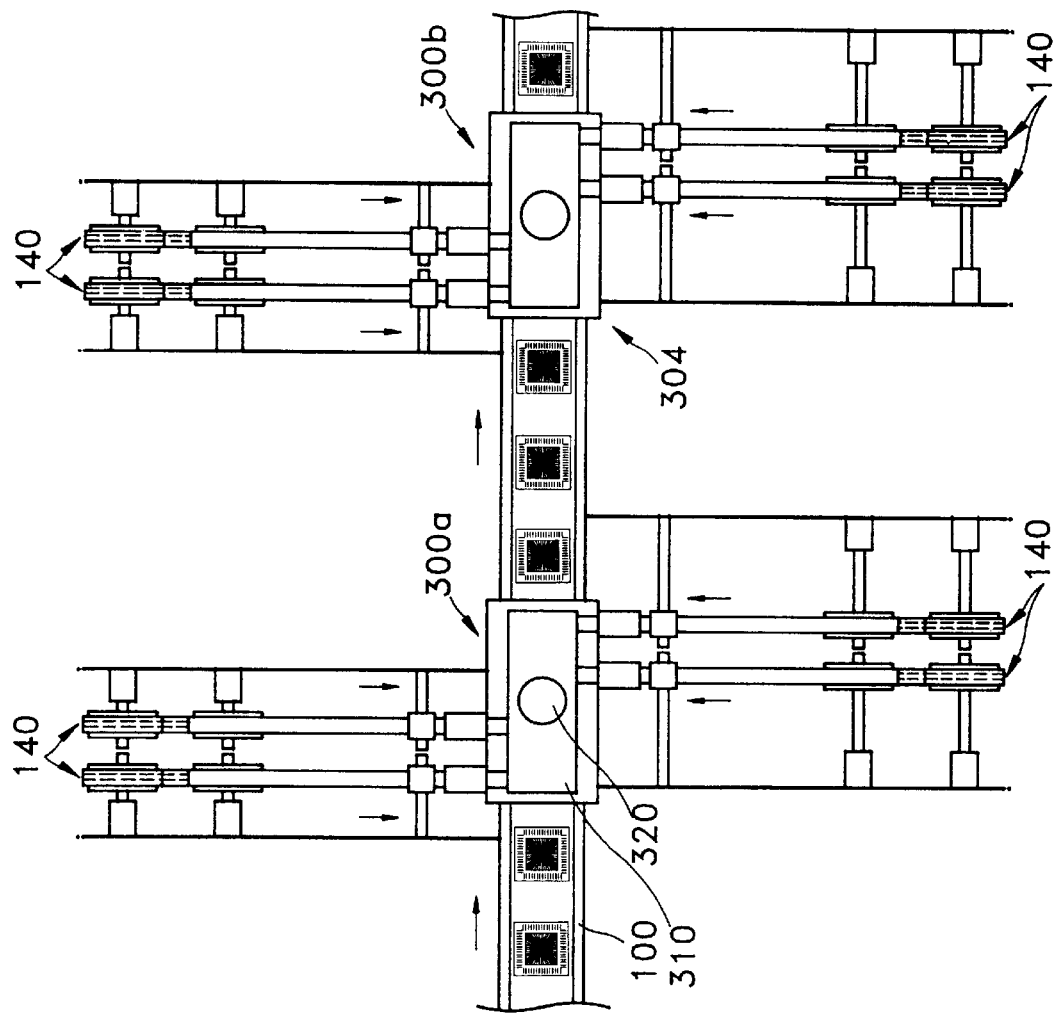
FIG. 10 is a plan view illustrating the lead frame taping apparatus shown in FIG. 9.

A lead frame taping apparatus according to a third embodiment of the present invention is shown in FIGS. 9 and 10. Here, the same reference numerals indicate the same members in the drawings. Referring to the drawings, the lead frame taping apparatus of the present embodiment includes a plurality of punching portions 300a and 300b and each of punching portions 300a and 300b concurrently attaches the tapes 350a, 350b, 350c, and 350d to at least two lead frames 100a and 100b (separated by a dotted line).

In the operation of the lead frame taping apparatus according to the present embodiment, the lead frame supplying portion 260 intermittently supplies the lead frame 100 to the plurality of punching portions 300a and 300b by a number of pitches equal to a multiple of the number of the punching portions. That is, when there are provided two punching portions 300a and 300b, each attaching the tapes 350a, 350b, 350c, and 350d to two lead frames 100a and 100b, the lead frame 100 is intermittently supplied at a number of pitches equal to twice the number of the punching portions, i.e., four pitches.

When the lead frame 100 is supplied, the tapes 350a, 350b, 350c and 350d are provided by the tape supplying portion 140. Then, the punch 310 descends toward the punching mold 330 by the action of the actuator 320 so that the tapes 350a, 350b, 350c and 350d are cut and attached at the lead frame 100.

According to the present embodiment, the plurality of punching portions 300a and 300b can be operated either concurrently or at a different time. When the punching portions 300a and 300b are operated at a different time, the operation time of the actuator 320 located at the N-th and the (N+1)th positions can be different from each other. Here, the lead frame 100 of a different type can be selectively taped by placing a different type of punch 310 and the punching mold 330 at each of the punching portions 300a and 300b. That is, when a taping process is performed to the lead frame 100 of an A type, the punching portion 300a is operated and another punching portion 300b is halted. Then, when the lead frame 100 of a B type is supplied, the punching portion 300a halts and another punching portion 300b operates. Thus, the tapes can be continuously attached at the lead frame 100 of a different type by selectively operating the punching portions 300a and 300b. Namely, though the types of the lead frame 100 to be taped are different, there is no need to accordingly exchange the punch 310 and the punching mold 330.

A taping detecting sensor 270 for detecting the attachment of the tape can be further provided to the lead frame taping apparatus of the present embodiment.

As described above, in the lead frame taping apparatus according to the present invention, a plurality of punching portions are provided and each punching portion can concurrently attach the tape to at least two lead frames by punching one time, thereby increasing productivity. Also, the tape can be continuously attached to lead frames of different types by supporting different types of punches and punching molds in each of the punching portions, and selectively operating the punching portions, thereby reducing time required to exchange molds.

Further, in the lead frame taping apparatus of the present invention, a taping detecting sensor for detecting the taped lead frame is provided, thereby saving labor and detecting an inferior product.

Throughout the above description of the preferred embodiments, other implementations and changes to the preferred embodiments were discussed. This invention in its broader aspects is therefore not limited to the specific details or representative apparatus and methods shown and described.

What is claimed is:

1. A lead frame taping apparatus comprising:
   a lead frame-supplying portion for serially supplying at least two lead frames by intermittently moving said lead frames a distance of at least two pitches at a time;
   a tape-supplying portion for concurrently supplying a tape to each of said lead frames supplied by said lead frame supplying portion;
   at least two punches and at least two punching molds for concurrently cutting the supplied tapes and attaching the cut tape to each of said lead frames, wherein said tapes are supplied between said punches and said punching molds; and
   an actuator for moving said punches up and down.

2. A lead frame taping apparatus as claimed in claim 1, further comprising a taping detecting sensor for detecting by transmission and reception of radiation whether said tape is attached to said lead frames.

3. A lead frame taping apparatus as claimed in claim 2, wherein said taping detecting sensor comprises:
   an optical transmitter for emitting light around a portion of each respective lead frame where the tape is attached;
   an optical receiver for receiving the light passed through said respective lead frame;
   a signal converter for converting the received light to electrical signals;
   a controller for receiving the electrical signals from said signal converter and generating an operation stop signal when the tape is not attached; and
   a driver for receiving the operation stop signal from said controller and for halting the actuator from moving said punches.

4. A lead frame taping apparatus comprising:
   a plurality of punching portions, each portion having a punch and a punching mold for cutting a tape supplied therebetween and attaching the cut tape to a respective lead frame, and an actuator for moving said punch up and down;
   a lead frame-supplying portion for serially supplying said respective lead frames by intermittently moving said lead frames a distance of a plurality of pitches at a time toward said plurality of punching portions;
   a tape-supplying portion for supplying the tape to said respective punching portions; and
   wherein said plurality of punching portions are serially aligned along a direction in which the lead frame-supplying portion serially supplies the lead frames, and wherein the time the actuators of said plurality of punching portions move are different from each other.

5. A lead frame taping apparatus as claimed in claim 4, wherein the time of movement of said actuators corresponding to an N-th punching portion and corresponding to an (N+1)th punching portion are different from each other.

6. A lead frame taping apparatus as claimed in claim 5, wherein said punch and said punching mold of said N-th punching portion and said punch and said punching mold of said (N+1)th punching portion are different from each other.

7. A lead frame taping apparatus as claimed in claim 4, further comprising a taping detecting sensor for detecting by transmission and reception of radiation whether said tape is attached to said respective lead frames.

8. A lead frame taping apparatus as claimed in claim 7, wherein said taping detecting sensor comprises:
   an optical transmitter for emitting light around a portion of said lead frame where the tape is attached;
   an optical receiver for receiving the light passed through said lead frame;
   a signal converter for converting the received light to electrical signals;
   a controller for receiving the electrical signals from said signal converter and generating an operation stop signal when the tape is not attached; and
   a driver for receiving the operation stop signal from said controller and for halting the actuator from moving said punch.

9. A lead frame taping apparatus comprising:
   a plurality of punching portions, each portion having a punch and a punching mold for concurrently cutting a tape supplied therebetween and attaching the cut tape to at least two lead frames, and an actuator for moving said punch up and down;
   a lead frame supplying portion for intermittently supplying said lead frame by a number of pitches equal to a multiple of the number of said punching portions; and
   a tape supplying portion for supplying the tape to said plurality of punching portions.

10. A lead frame taping apparatus as claimed in claim 9, wherein said punch and said punching mold of said each punching portion concurrently attach the tape to two lead frames and said lead frame supplying portion supplies said lead frame by a number of pitches equal to twice the number of said punching portions.

11. A lead frame taping apparatus as claimed in claim 9, wherein the time each actuator of said plurality of punching portions moves is different.

12. A lead frame taping apparatus as claimed in claim 11, wherein the time said actuators corresponding to an N-th punching portion and an (N+1)th punching portion move are different from each other.

13. A lead frame taping apparatus as claimed in claim 12, wherein said N-th punching portion and said punch and said punching mold of said (N+1)th punching portion are different from each other.

14. A lead frame taping apparatus as claimed in claim 9, further comprising a taping detecting sensor for detecting by transmission and reception of radiation whether said tape is attached to said lead frame.

15. A lead frame taping apparatus as claimed in claim 14, wherein said taping detecting sensor comprises:

- an optical transmitter for emitting light around a portion of said lead frame where the tape is attached;
- an optical receiver for receiving the light passed through said lead frame;
- a signal converter for converting the received light to electrical signals;
- a controller for receiving the electrical signals from said signal converter and generating an operation stop signal when the tape is not attached; and
- a driver for receiving the operation stop signal from said controller and for halting the actuator from moving said punch.

16. A method of taping a lead frame using a lead frame taping apparatus having a plurality of aligned punching portions, a lead frame-supplying portion for supplying said lead frames, and a tape-supplying portion for supplying a tape to each of said plurality of aligned punching portions, said method comprising the steps of:

serially supplying said respective lead frames by said lead frame-supplying portion by intermittently moving said lead frames a distance of a plurality of pitches at a time in a direction of alignment toward said plurality of punching portions, wherein the direction of alignment is the direction along which the plurality of aligned punching portions are aligned;

driving said plurality of punching portions such that each punching portion operates at a different time; and operating said plurality of aligned punching portions to cut and attach the tape supplied by said tape-supplying portion to said respective lead frames.

17. The method of claim 16, wherein the time of operation of an N-th punching portion of said plurality of aligned punching portions and an (N+1)th punching portion of said plurality of aligned punching portions are different from each other.

* * * * *